(12) United States Patent
Honda

(10) Patent No.: US 7,508,854 B2
(45) Date of Patent: Mar. 24, 2009

(54) SEMICONDUCTOR LASER DEVICE

(75) Inventor: Shoji Honda, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 10/578,869

(22) PCT Filed: Nov. 11, 2004

(86) PCT No.: PCT/JP2004/016768

§ 371 (c)(1),
(2), (4) Date: May 11, 2006

(87) PCT Pub. No.: WO2005/048421

PCT Pub. Date: May 26, 2005

(65) Prior Publication Data

US 2007/0086494 A1 Apr. 19, 2007

(30) Foreign Application Priority Data

Nov. 14, 2003 (JP) .............................. 2003-384628

(51) Int. Cl.
*H01S 3/04* (2006.01)
(52) U.S. Cl. ...................................... 372/36; 372/43.01
(58) Field of Classification Search .................... 372/36, 372/43.01
See application file for complete search history.

(56) References Cited

U.S. PATENT DOCUMENTS

| | | | | |
|---|---|---|---|---|
| 4,351,051 A | * | 9/1982 | van Alem et al. | 372/36 |
| 5,089,861 A | * | 2/1992 | Tanaka et al. | 372/36 |
| 6,449,296 B1 | * | 9/2002 | Hamasaki et al. | 372/36 |
| 2001/0026991 A1 | * | 10/2001 | Ichikawa et al. | 438/411 |
| 2002/0154667 A1 | * | 10/2002 | Shimonaka | 372/50 |
| 2003/0165167 A1 | * | 9/2003 | Ichikawa et al. | 372/36 |
| 2004/0105472 A1 | * | 6/2004 | Hosokawa et al. | 372/36 |
| 2005/0105572 A1 | * | 5/2005 | Simoun-Ou et al. | 372/36 |
| 2005/0265410 A1 | * | 12/2005 | Cho | 372/36 |

FOREIGN PATENT DOCUMENTS

| | | |
|---|---|---|
| JP | 58-16585 A | 1/1983 |
| JP | 63-102387 A | 5/1988 |
| JP | 2-9461 | 1/1990 |
| JP | 9-148680 A | 6/1997 |
| JP | 2001-267674 A | 9/2001 |
| JP | 2004-179494 A | 6/2004 |

* cited by examiner

*Primary Examiner*—Minsun Harvey
*Assistant Examiner*—Joshua King
(74) *Attorney, Agent, or Firm*—McDermott Will & Emery LLP

(57) ABSTRACT

A semiconductor laser device of the present invention is provided with a base portion (2) having a horizontal top surface (S), a heat sink portion (3) that has a vertical element mount surface (7) and is located above the top surface (S) of the base portion (2), and a semiconductor laser element (4) that is fixed to the element mount surface (7). There is formed a depression (9) in the base portion (2) located immediately below the semiconductor laser element (4) so as to receive part of the semiconductor laser element (4) disposed in the depression (9). The element mount surface (7) is located inward of the inner side surface of the depression (9).

7 Claims, 3 Drawing Sheets

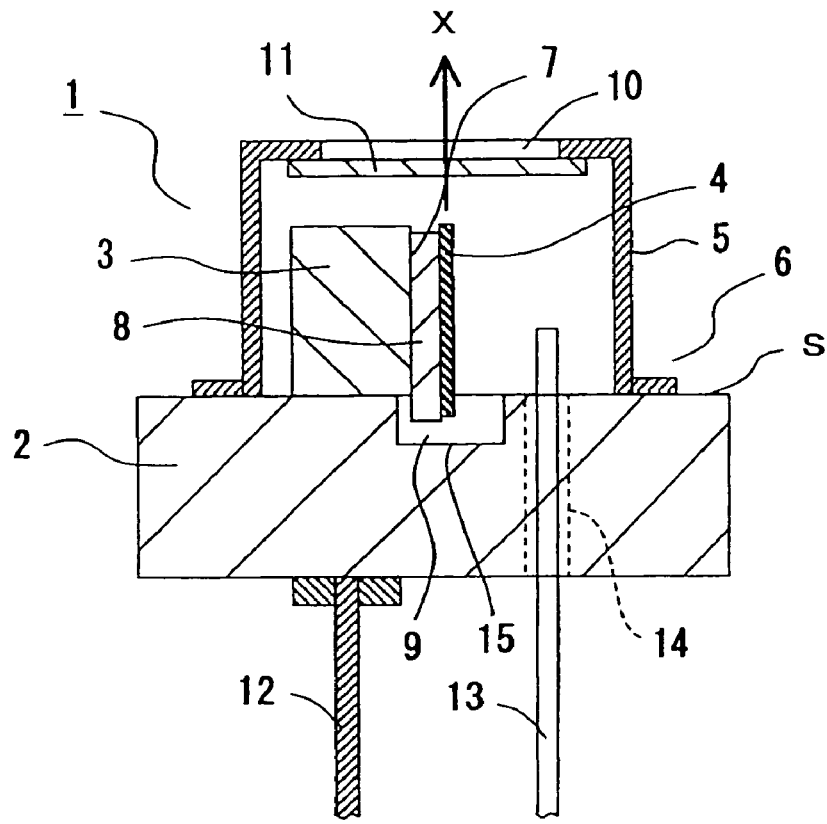
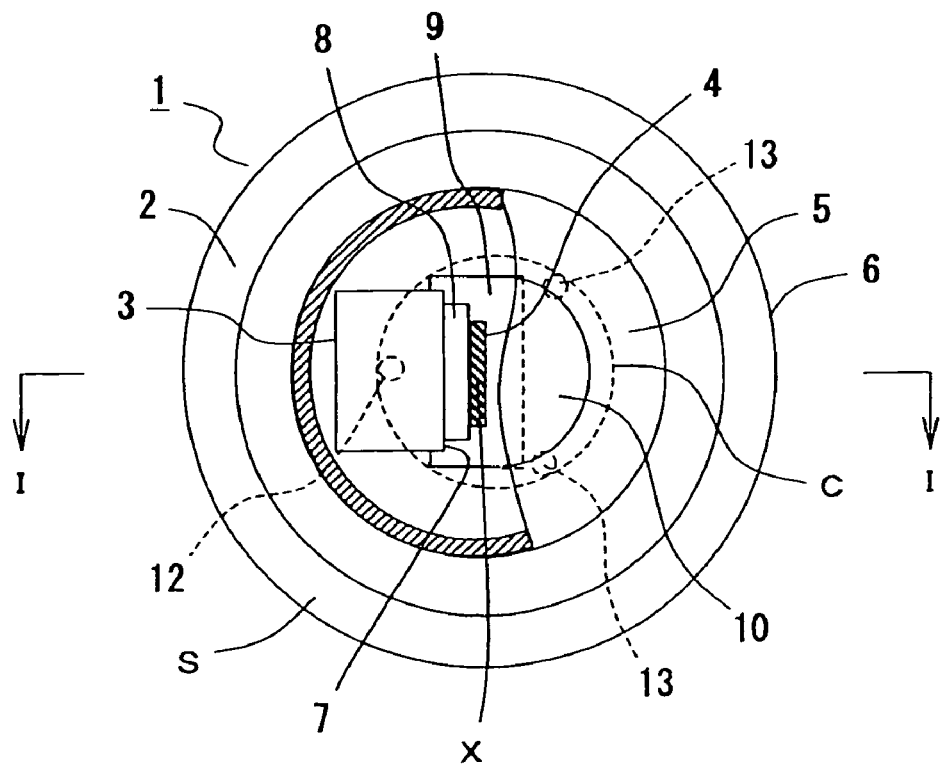

SEMICONDUCTOR LASER DEVICE

RELATED APPLICATIONS

This application is the U.S. National Phase under 35 U.S.C. § 371 of International Application No. PCT/JP2004/016768, filed on Nov. 11, 2004, which in turn claims the benefit of Japanese Application No. 2003-384628, filed on Nov. 14, 2003, the disclosures of which Applications are incorporated by reference herein.

TECHNICAL FIELD

The present invention relates to a semiconductor laser device.

BACKGROUND ART

Semiconductor laser elements for DVD-Rs, CD-Rs, Blu-Ray disks and the like are required to have high output power. In a semiconductor laser device, such a semiconductor laser element is mounted either directly or via a submount on a highly efficient heat sink to dissipate heat generated from the semiconductor laser element. The heat sink is fixed to a top surface of a disk-shaped base in such a way that an element mount surface is perpendicular thereto. The base has, in the top surface thereof, a depression that is located immediately below the semiconductor laser element. As disclosed in Patent Publication 1, this depression is mainly used for receiving a monitoring light-receiving element to be disposed therein or a lead pin to be disposed therein that receives a signal from a light-receiving element that also serves as a submount.

A high output power semiconductor laser element can be achieved by making longer the cavity length of the semiconductor laser element. Thus, we have made higher the heat sink to make longer the semiconductor laser element, only to find that the position of the luminous point of the semiconductor laser element varies. The problem here is that such an element does not conform to standard specifications, and makes the device larger. We have also made the base thinner, only to find that the thinner base reduces the heat capacity, leading to reduced heat dissipation characteristic.

Therefore, Patent Publication 2 discloses a semiconductor laser device that permits the mounting of a longer semiconductor laser element without changing the position of the luminous point of the semiconductor laser element by disposing the semiconductor laser element in such a way that part thereof projects into a depression formed in a top surface of a base.

However, when a heat sink is formed separately from the base, an error, if any, that occurs when the heat sink is mounted thereon makes an element mount surface not flush with an inner side surface of the depression. When the element mount surface is located outside the rim of the depression, a lower end portion of the semiconductor laser element or the submount makes contact with the inner side surface of the depression with priority, forming clearance between it and the heat sink. The clearance thus formed narrows the heat dissipation path, and thereby impairing the heat dissipation characteristic. Moreover, even when the heat sink portion and the base portion are formed in one piece, an upper part of the element mount surface located above the base becomes more recessed than a lower part thereof after post-processing of the element mount surface such as metal stamping and polishing, producing surface discontinuity. In this case, the semiconductor laser element or the submount does not make close contact with the heat sink, as in the case where they are formed separately, impairing the heat dissipation characteristic.

Patent Publication 1: Japanese Patent Application Laid-Open No. 2001-267674

Patent Publication 2: Japanese Patent Application Laid-Open No. 2004-179494

DISCLOSURE OF THE INVENTION

Problems to be Solved by the Invention

In view of the problems described above, it is an object of the present invention to provide a semiconductor laser device that offers high output power by permitting the mounting of a semiconductor laser element with long cavity length without varying the position of the luminous point thereof and without reducing a heat dissipation characteristic.

Means for Solving the Problem

To achieve the above object, according to one aspect of the present invention, in a semiconductor laser device provided with: a base portion having a horizontal top surface; a heat sink portion that has a vertical element mount surface and is located above the top surface of the base portion; a semiconductor laser element that is fixed to the element mount surface; and a depression that is formed in the top surface of the base portion located immediately below the semiconductor laser element so as to receive part of the semiconductor laser element disposed therein, the heat sink portion is fixed to the base portion in such a way that the element mount surface is located inward of the inner side surface of the depression.

Preferably, according to another aspect of the present invention, in the semiconductor laser device configured as described above, the depression is formed within the area of a circle including, on a circumference thereof, a plurality of lead pins that feed a voltage to the semiconductor laser element.

Preferably, according to another aspect of the present invention, in the semiconductor laser device configured as described above, the semiconductor laser element is fixed to the heat sink portion via a submount, part of which is disposed in the depression.

Preferably, according to another aspect of the present invention, in the semiconductor laser device configured as described above, the length of the semiconductor laser element is longer than the height of the heat sink portion.

Preferably, according to another aspect of the present invention, in the semiconductor laser device configured as described above, the base portion and the heat sink portion are formed as a single member.

Preferably, according to another aspect of the present invention, in the semiconductor laser device configured as described above, the depression has a rough bottom surface.

Preferably, according to another aspect of the present invention, in the semiconductor laser device configured as described above, the depression has an inclined bottom surface.

BRIEF DESCRIPTION OF DRAWINGS

[FIG. 1] A sectional view showing the semiconductor laser device of a first embodiment of the present invention.

[FIG. 2] A plan view showing the semiconductor laser device of the first embodiment of the present invention.

Figure 3:
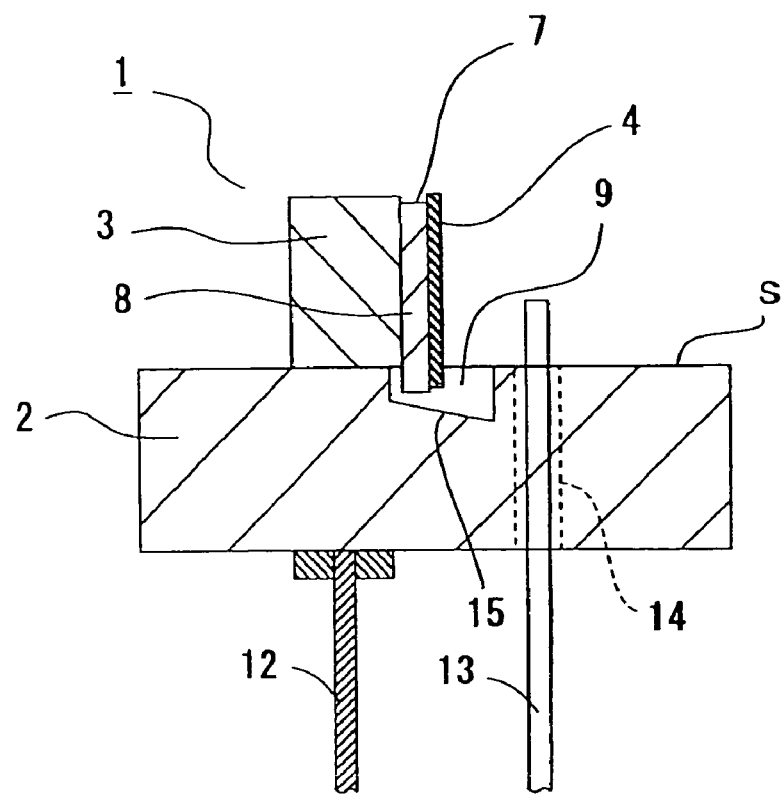
[FIG. 3] sectional view showing the semiconductor laser device of a second embodiment of the present invention.

LIST OF REFERENCE SYMBOLS 1 semiconductor laser device
2 base portion
3 heat sink portion
4 semiconductor laser element
8 submount
9 depression
12, 13 lead pin

BEST MODE FOR CARRYING OUT THE INVENTION

Hereinafter, a can-type semiconductor laser device is taken up as an example to describe how the present invention is carried out with reference to the accompanying drawings. FIG. 1 is a sectional view (taken along I-I of FIG. 2) of the semiconductor laser device of a first embodiment of the present invention, and FIG. 2 is a plan view, partially broken away, of the semiconductor laser device of the first embodiment.

A semiconductor laser device 1 is provided with a base portion 2, a heat sink portion 3, and a semiconductor laser element 4. The base portion 2 and the heat sink portion 3 constitute, together with a cap 5, a package 6 in which a semiconductor laser element 4 is to be mounted.

The base portion 2 is a member with a superior heat dissipation capability made of metal such as iron and copper, and has a predetermined thickness. The base portion 2 has a top surface extending horizontally, and an outer circumferential portion of the top surface serves, when mounted in an optical device such as an optical pickup, as a mount reference plane S. The base portion 2 is of the shape of a circle centered on an optical axis X of the semiconductor laser element 4 in plan view. It should be understood, however, that it may be of any other shape, for example, quadrangular.

The heat sink portion 3 is a member with a superior heat dissipation capability made of metal such as iron and copper, and has a predetermined volume for improving the heat capacity. The height of the heat sink portion 3 is on the order of 1.27 mm above the reference plane S on the top surface of the base portion 2. The heat sink portion 3 has vertical surfaces, one of which is used as an element mount surface 7 on which the semiconductor laser element 4 is mounted. The element mount surface 7 and the top surface of the base portion 2 are kept orthogonal (perpendicular) to each other. The heat sink portion 3 is fixed to the top surface of the base portion 2 by using an electrically conductive bonding agent such as solder, and therefore is located above the reference plane S of the base portion 2.

The semiconductor laser element 4 is fixed to the element mount surface 7 in such a way that the optical axis X thereof is parallel to the element mount surface 7. In this example, although the semiconductor laser element 4 can be directly fixed to the heat sink portion 3, it is fixed thereto via a submount 8 having substantially the same length (having the same length or a slightly shorter or longer length) as the semiconductor laser element 4. The submount 8 is used, for example, for relieving stress between the semiconductor laser element 4 and the heat sink portion 3 and for improving heat dissipation, and can be formed of a semiconductor having the same characteristic as the semiconductor laser element 4, for example, a semiconductor such as silicon and nitride aluminum. In a surface of the submount 8 on which the semiconductor laser element 4 is mounted, various electrodes (such as an element mount electrode and a wire bonding electrode) that permit the passage of electric current through the semiconductor laser element 4 can be formed as required. In this example in which secondary laser light is not monitored, although a light-receiving element can be integrated into the submount 8, the submount 8 does not have a light-receiving element.

The base portion 2 has, in a region of the top surface thereof located immediately below the semiconductor laser element 4, a depression 9 formed for receiving part (a lower part) of the semiconductor laser element 4 inserted therein. The area of the depression 9 is wide enough to receive the bottom surface of the semiconductor laser element 4. In this example, it is wide enough to also receive the bottom surface of the submount 8 as well, because the semiconductor laser element 4 and the submount 8 for the mounting thereof are provided in an integrated manner.

The semiconductor laser element 4 is made longer than the height of the heat sink portion 3. In general, the length of the semiconductor laser element 4 is less than or equal to 1 mm and in the range of 0.3 to 0.7 mm. In this example, however, the one of around 1.5 mm that is longer than the height (1.27 mm) of the heat sink portion 3 is used to offer high output power.

In this embodiment, although the length of the semiconductor laser element 4 is made longer than the height of the heat sink portion 3 to offer a high output power semiconductor laser element 4, an increase in length of the semiconductor laser element 4 is accommodated by the depression 9 that is formed in the base portion 2 for receiving part of the semiconductor laser element 4, making it possible to keep the position of the luminous point of the semiconductor laser element 4 at the same height (1.27 mm) as usual. This makes it possible to maintain compatibility with a conventional semiconductor laser device.

The depression 9 of the base portion 2 is deep enough to absorb a difference between the length of the semiconductor laser element 4 and the height of the heat sink portion 3. In this example, the depth of the depression 9 is so defined that the depression 9 does not penetrate the base portion 2 (e.g., in the range of 0.3 to 1 mm). It should be understood, however, that the depression 9 can be formed so as to penetrate the base portion 2.

The base portion 2 is fitted with a cylindrical cap 5 to cover the semiconductor laser element 4. The cap 5 is made of metal that can be welded to the base portion 2, and has a window 10 formed therein to permit extraction of the laser light. The window 10 is covered with an optically transparent lid 11 made of glass or the like. The base portion 2 and the cap 5 form a sealed space, making it possible to prevent the characteristic of the semiconductor laser element 4 from being varied by contact with outside air. When the characteristic of the semiconductor laser element 4 does not vary, for example, the use of the cap 5 can be omitted if necessary.

The base portion 2 is fitted with a plurality of lead pins 12 and 13 that permit the passage of electric current through the semiconductor laser element 4. One lead pin (12) is fixed to the base portion 2 by welding or the like, and the other lead pin (13) is fixed to the base portion 2 via an insulating material 14. The lead pins 12 and 13 and the semiconductor laser element 4 are electrically connected by wire bonding as with a gold wire.

The semiconductor laser device 1 is produced as follows: the base portion 2 previously fitted with the heat sink portion 3 and the lead pins 12 and 13 is prepared to form the package 6. Then, after the semiconductor laser element 4 integrated with the submount 8 is fixed to the heat sink portion 3, wire bonding is applied to the semiconductor laser element 4. Finally, the cap 5 is attached.

When a predetermined voltage is applied to the semiconductor laser device 1 configured as described above via the lead pins 12 and 13, the semiconductor laser element 4 emits light, and produces laser light from the top surface thereof in the direction indicated by arrow X. The heat generated from the semiconductor laser element 4 is transmitted, via the submount 8 and the heat sink portion 3, to the base portion 2, the cap 5, and the lead pins 12 and 13, and is then dissipated to the outside.

If necessary, a light-receiving element for monitoring the light emitted from the semiconductor laser element 4 is incorporated into an optical device in which the semiconductor laser device 1 is built, because the semiconductor laser device 1 of this embodiment does not have a monitor light-receiving element.

This embodiment deals with a case where the heat sink portion 3 is fixed to the base portion 2 in such a way that the element mount surface 7 is located slightly inward of the inner side surface of the depression 9. Efficient dissipation of heat from the semiconductor laser element 4 requires a wide heat dissipation path to improve a heat dissipation characteristic. Therefore, it is preferable that the element mount surface 7 of the heat sink portion 3 and the inner side surface of the depression 9 be flush with each other so that the submount 8 (or the semiconductor laser element 4 when no submount 8 is provided) makes contact simultaneously with the heat sink portion 3 (the element mount surface 7) and the base portion 2 (the inner side surface of the depression 9).

However, when the element mount surface 7 of the heat sink portion 3 is located outward of the inner side surface of the depression 9 because of dimensional deviation of the base portion 2 or the heat sink portion 3 or an error that occurs during mounting, a lower end of the submount 8 (or the semiconductor laser element 4) makes contact with the inner side surface of the depression 9 with priority, forming clearance between the rear surface of the submount 8 (or the semiconductor laser element 4) and the element mount surface 7. The clearance thus formed narrows the heat dissipation path, and thereby impairing the heat dissipation characteristic.

With the configuration of this embodiment, even when there is a possibility of occurrence of dimensional deviation or mounting error of the base portion 2 or the heat sink portion 3, it is possible to fix the heat sink portion 3 and the submount 8 (or the semiconductor laser element 4) with the element mount surface 7 of the former kept in intimate contact with the latter. This makes it possible to ensure the stable heat dissipation path for heat generated from the semiconductor laser element 4. It is preferable that the distance from the element mount surface 7 to the inner side surface of the depression 9 be so set that, even when the above-described error occurs one after another and then reaches a maximum level, the element mount surface 7 is located inward of the depression 9.

Note that, when the depression 9 becomes too wide in area, it increases in volume, and the greater the volume thereof, the smaller the volume of the base portion 2. This reduces the heat capacity, leading to lower heat dissipation efficiency. Therefore, in this embodiment, the area of the depression 9 is so set as to be confined within the area of a circle C including the plurality of lead pins 12 and 13 on its circumference.

Next, a second embodiment of the present invention will be described with reference to the drawing. FIG. 3 is a sectional view of the semiconductor laser device (in an uncapped state) of the second embodiment. In the first embodiment, a bottom surface 15 of the depression 9 is parallel to the top surface of the base portion 2. On the other hand, this embodiment deals with a case where the bottom surface 15 of the depression 9 is inclined relative to the top surface of the base portion 2. Here, other elements such as the base portion 2, the heat sink portion 3, and the semiconductor laser element 4 are found also in the first embodiment, and their descriptions will not be repeated.

The semiconductor laser element 4 emits laser light (secondary laser light) also from the bottom surface thereof, and therefore suffers from noise resulting from so-called feedback light, i.e., the secondary laser light that has been reflected from the bottom surface of the depression 9 and then returned to the point of origin. With the configuration in which the bottom surface 15 is an inclined plane that permits oblique reflection of the secondary laser light, it is possible to prevent the secondary laser light from being returned to the point of origin.

Figure 4:
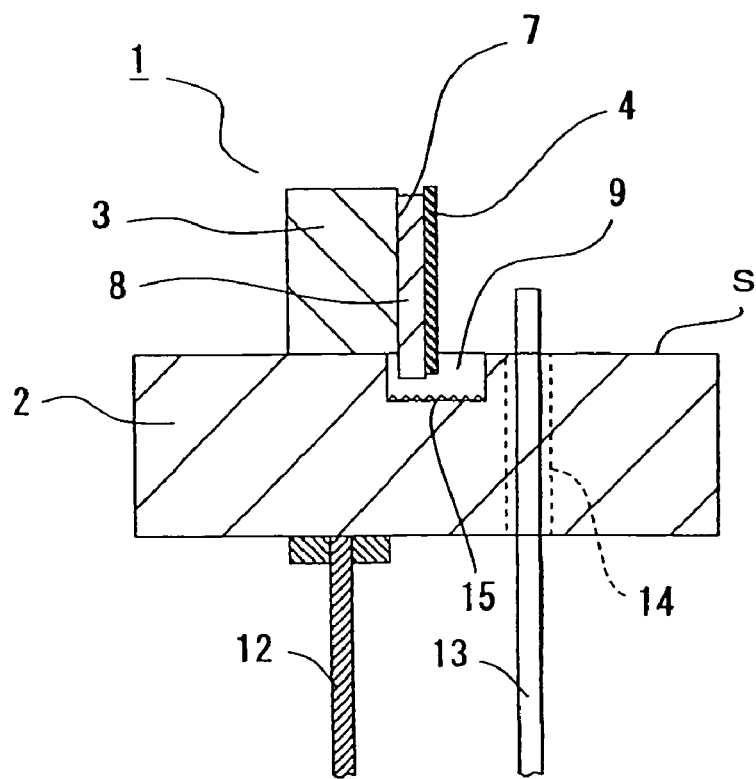
[FIG. 4] A sectional view showing the semiconductor laser device of a third embodiment of the present invention.

Next, a third embodiment of the present invention will be described with reference to the drawing. FIG. 4 is a sectional view of the semiconductor laser device (in an uncapped state) of the third embodiment. This embodiment deals with a case where the bottom surface 15 of the depression 9 is made rougher that the top surface of the base portion 2. Here, other elements such as the base portion 2, the heat sink portion 3, and the semiconductor laser element 4 are found also in the first embodiment, and their descriptions will not be repeated. With the configuration in which the bottom surface 15 is made rough to diffusely reflect the secondary laser light, it is possible to effectively suppress the influence of the feedback light as in the second embodiment.

Figure 5:
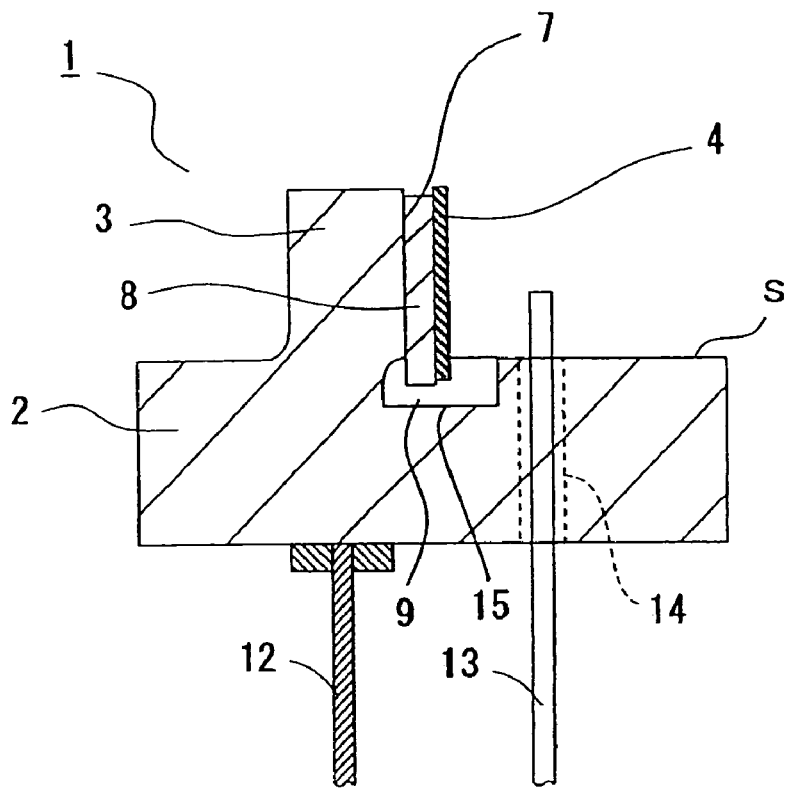
[FIG. 5] A sectional view showing the semiconductor laser device of a fourth embodiment of the present invention.

Next, a fourth embodiment of the present invention will be described with reference to the drawing. FIG. 5 is a sectional view of the semiconductor laser device (in an uncapped state) of the fourth embodiment. The embodiments described above deal with cases where the base portion 2 and the heat sink portion 3 are formed separately, and then connected and fixed together. In this embodiment, the base portion 2 and the heat sink portion 3 are formed in one piece from the beginning. Here, other elements are found also in the first embodiment, and their descriptions will not be repeated.

In this embodiment, the base portion 2 and the heat sink portion 3 are formed as a single member, and then pressure is applied to the heat sink portion 3 from the back thereof (from the left side in FIG. 5) by means of metal stamping or the like, whereby the element mount surface 7 is moved inward (in a rightward direction in FIG. 5) of the inner side surface of the depression 9. In this way, they are formed in one piece from the beginning, and therefore, as compared with the embodiments described above, it is possible to prevent misalignment and a poor connection in a connected region. This makes it possible to improve the heat dissipation characteristic, and reduce the number of fabrication processes. Note that, in this embodiment, as in the second and third embodiments, the bottom surface 15 of the depression 9 may be made inclined or rough so as to suppress the influence of the feedback light.

Figure 6:
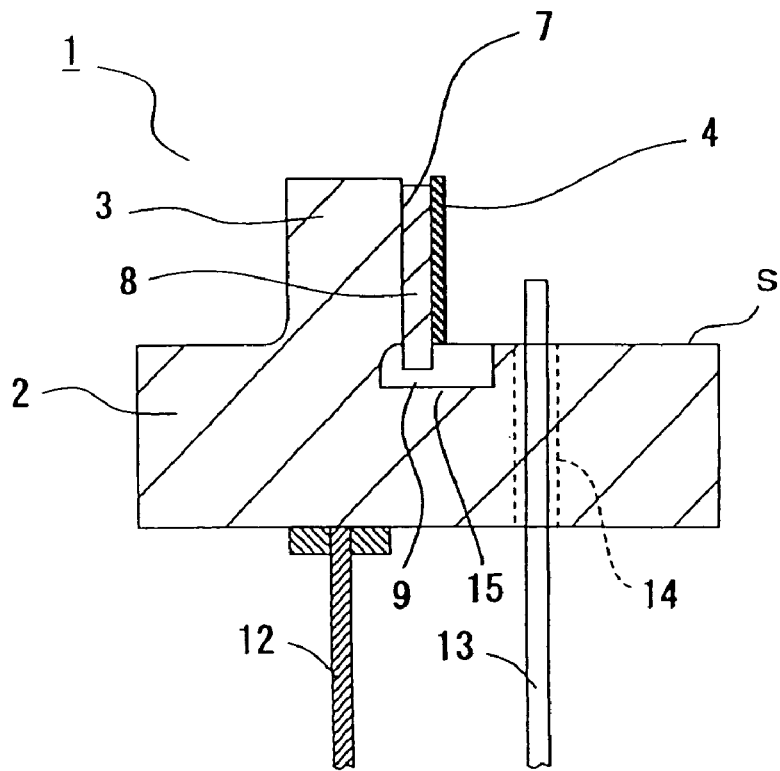
[FIG. 6] A sectional view showing the semiconductor laser device of a fifth embodiment of the present invention.

Next, a fifth embodiment of the present invention will be described with reference to the drawing. FIG. 6 is a sectional view of the semiconductor laser device (in an uncapped state) of the fifth embodiment. In the fourth embodiment described above, the lower ends of the semiconductor laser element 4 and the submount 8 are inserted inside the depression 9. On the other hand, this embodiment deals with a case where the lower end of the submount 8 alone is disposed inside the depression 9, and the bottom surface of the semiconductor laser element 4 is flush with the reference plane S of the base portion 2. Here, other elements are found also in the fourth embodiment, and their descriptions will not be repeated.

With the configuration of this embodiment, it is possible to ensure the heat dissipation path by making wider the area of contact between the heat sink 3 and the submount 8, and, in addition, to mount the semiconductor laser element 4 on the submount 8 only by sliding it in one direction parallel to the reference plane S of the base portion 2 when the semiconductor laser device 1 is fabricated. As compared with the fourth embodiment in which the semiconductor laser element 4 needs to be moved in two directions, i.e., in a direction parallel to the reference plane S and in a direction perpendicular thereto, workability during fabrication is improved.

It is to be understood that the present invention may be carried out in any other manner than specifically described above as an embodiment, and many modifications and variations are possible within the scope of the invention. For example, dimensions such as the height of the heat sink portion 3, the length of the semiconductor laser element 4, and the depth of the depression 9 are taken up as examples, and can be changed to other values as required according to the specifications of the semiconductor laser device.

INDUSTRIAL APPLICABILITY

In the present invention, a depression is formed in a base portion located immediately below a semiconductor laser element, and a heat sink portion is fixed to the base portion in such a way that an element mount surface is located slightly inward of the inner side surface of the depression. This makes it possible to fix the element mount surface and a submount (or the semiconductor laser element) with the former kept in intimate contact with the latter, eliminating the need to change the position of the luminous point of the semiconductor laser element that is made longer to offer high output power, for example. This makes it possible to maintain compatibility with conventional standard specifications, and ensure the stable heat dissipation path for heat generated from the semiconductor laser element.

Moreover, when the depression formed in the base portion becomes too wide in area, the heat capacity of the base portion is reduced, leading to lower heat dissipation efficiency. On the other hand, by forming the depression within the area of a circle including on its circumference a plurality of lead pins that feed a voltage to the semiconductor laser element, it is possible to maintain enough volume of the base portion to suppress the reduction of the heat capacity.

Moreover, part of the submount that fixes the semiconductor laser element is also disposed inside the depression. This makes it possible to suppress the increase in height of the semiconductor laser device.

Moreover, by making the length of the semiconductor laser element longer than the height of the heat sink portion, it is possible to achieve a configuration that is effective for high output power.

Moreover, by forming the base portion and the heat sink portion as a single member, it is possible to improve the heat dissipation characteristic, and reduce the number of fabrication processes.

Moreover, a bottom surface of the depression is made rough or inclined. This makes it possible to effectively suppress the influence of secondary laser light that is emitted from the rear of the semiconductor laser element and received as feedback light.

The invention claimed is:

1. A semiconductor laser device comprising:

A base portion having a horizontal top surface;

A heat sink portion that has a vertical element mount surface and is located above the top surface of the base portion;

A semiconductor laser element that is fixed to the element mount surface and

A depression that is formed in the top surface of the base portion located immediately below the semiconductor laser element so as to receive part of the semiconductor laser element disposed therein, Wherein the heat sink portion is fixed to the base portion in such a way that the element mount surface is located inward of an inner side surface of the depression and that a portion of a bottom surface of the heat sink portion does not contact with the base portion, and wherein the semiconductor laser element is fixed to the heat sink portion via a submount, part of which is disposed in the depression, and the top surface of the submount is disposed below the top surface of the semiconductor laser element and the bottom surface of the submount is disposed below the bottom surface of the semiconductor laser element.

2. The semiconductor laser device of claim 1, wherein the depression is formed within an area of a circle including, on a circumference thereof, a plurality of lead pins that feed a voltage to the semiconductor laser element.

3. The semiconductor laser device of claim 1, wherein a length of the semiconductor laser element is longer than a height of the heat sink portion.

4. The semiconductor laser device of claim 1, wherein the base portion and the heat sink portion are formed as a single member.

5. The semiconductor laser device of claim 1, 2, 3, or 4,

Wherein the depression has a rough bottom surface that prevents feedback light from being produced by diffusely reflecting secondary laser light.

6. The semiconductor laser device of claim 1, 2, 3, or 4,

Wherein the depression has an inclined bottom surface.

7. The semiconductor laser device of claim 1, wherein the portion of the bottom surface of the heat sink portion lies over the depression.

* * * * *